US006434018B1

(12) United States Patent
Waltz

(10) Patent No.: US 6,434,018 B1
(45) Date of Patent: Aug. 13, 2002

(54) RACK MOUNT SYSTEM FOR PLUGGABLE COMPUTER MODULES

(75) Inventor: Eike Waltz, Aptos, CA (US)

(73) Assignee: Rittal Corp., Springfield, OH (US)

( * ) Notice: Subject to any disclaimer, the term of this patent is extended or adjusted under 35 U.S.C. 154(b) by 0 days.

(21) Appl. No.: 09/698,347

(22) Filed: Oct. 27, 2000

(51) Int. Cl.[7] .............................. H05K 5/00; H05K 7/14; A47B 81/00
(52) U.S. Cl. ........................ 361/796; 361/725; 361/727; 361/753; 312/265.6; 312/223.2; 211/41.17
(58) Field of Search ................................. 361/727, 729, 361/752, 753, 796, 797, 803, 801; 312/223.1–223.2, 265.1, 265.6; 211/41.17; 220/4.02

(56) References Cited

U.S. PATENT DOCUMENTS

| | | | |
|---|---|---|---|
| 3,723,823 A | | 3/1973 | Lit |
| 3,733,523 A | | 5/1973 | Reynolds |
| 3,863,113 A | | 1/1975 | Ward |
| 4,022,326 A | | 5/1977 | Marconi |
| 4,327,835 A | | 5/1982 | Leger |
| 4,702,535 A | * | 10/1987 | Beun .......................... 312/308 |
| 5,579,204 A | * | 11/1996 | Nelson et al. .............. 361/685 |
| 5,689,406 A | | 11/1997 | Wood |
| 5,708,563 A | * | 1/1998 | Cranston, III et al. ...... 361/683 |
| 5,816,673 A | * | 10/1998 | Sauer et al. ............. 312/223.2 |
| 5,949,645 A | | 9/1999 | Aziz |
| 6,008,995 A | | 12/1999 | Pusateri |
| 6,128,196 A | * | 10/2000 | Hoyle, Jr. et al. .......... 361/752 |

* cited by examiner

Primary Examiner—Jayprakash N. Gandhi
(74) Attorney, Agent, or Firm—Porter, Wright, Morris & Arthur LLP

(57) ABSTRACT

A modular chassis for housing pluggable computer module includes pre-assembled and pre-wired bottom functional section having desired computer components mounted thereto, a pre-assembled and pre-wired inner functional section for receiving the pluggable modules, and a pre-assembled and pre-wired top functional section having desired computer components mounted thereto. The inner functional section is supported within and electrically interconnected to the bottom functional section and is removable from the bottom functional section. The top functional section cooperates with the bottom functional section to at least partially enclose the inner functional section and retain the inner functional section therein. The top functional section is electrically interconnected to the inner functional section. The top functional section is removable from the inner functional section and the bottom functional section. The inner functional section is provided with guide features to position the inner functional section relative to the bottom functional section and to position the top functional section relative to the inner functional section. Also disclosed is a method of assembling the modular chassis.

32 Claims, 3 Drawing Sheets ured, assembled, and repaired and/or has a less industrial looking design.

RACK MOUNT SYSTEM FOR PLUGGABLE COMPUTER MODULES

FIELD OF THE INVENTION

The present invention generally relates to a rack mount system for housing pluggable computer modules and, more particularly, to such a rack mount system having a modular chassis.

BACKGROUND OF THE INVENTION

Conventional rack mount systems such as those used for data processing systems and the like typically house pluggable computer modules in a computer chassis or housing often referred to as a card cage or subrack. A variety of different types of computer modules can be utilized to perform various functions such as, for example, CPU modules, peripheral modules, drive modules, input/output modules, and power supply modules. Each pluggable computer module typically includes at least one circuit board or card, a front panel located at the front of the circuit board, and a pluggable electrical connector located at the back of the circuit board. The circuit board can be either at least partially enclosed by a housing or fully exposed. The electrical connector is typically adapted to cooperate with a cooperating electrical connector of the card cage to automatically "plug-in" or electrically couple the computer module to the card cage when the computer module is fully inserted into the card cage.

The computer chassis or card cage is conventionally of a monolithic design, that is, of a single section or structure. Typically, the computer chassis fulfils the functional and dimensional requirements of the chassis/module interconnect system, that is, the pluggable electrical connector. While these rack mount systems may adequately perform their functions, they are relatively difficult and expensive to manufacture, assemble, and repair. Additionally, these rack mount systems have a very industrious looking design. Accordingly, there is a need in the art for an improved rack mount system which is more easily manufactured, assembled, and repaired and/or has a less industrial looking design.

SUMMARY OF THE INVENTION

The present invention provides an improved rack mount system which overcomes at least some of the above-noted problems of the related art. According to the present invention, a modular chassis comprises, in combination a bottom functional section, an inner functional section for receiving the pluggable modules, and a top functional section. The inner functional section is supported within the bottom functional section and is removable from the bottom functional section. The top functional section cooperates with the bottom functional section to at least partially enclose the inner functional section and retains the inner functional section therein. The top functional section is removable from the inner functional section.

According to another aspect of the present invention, a modular chassis for housing pluggable computer modules includes a bottom functional section, an inner functional section for receiving the pluggable modules, and a top functional section cooperating with the bottom functional section to at least partially enclose the inner functional section. The inner functional section is supported within the bottom functional section. The inner functional section has a pair of vertically disposed and spaced-apart endplates. The endplates are connected by one of a plurality of first horizontal members having flexible module guides and a plurality of second horizontal members having fixed module guides. The endplates are adapted to cooperate with both the first horizontal members and the second horizontal members.

According to yet another aspect of the present invention, a method of assembling a modular chassis for housing pluggable computer modules includes the steps of: pre-assembling and wiring a bottom functional section, pre-assembling and wiring an inner functional section for receiving the pluggable computer modules, and pre-assembling and wiring a top functional section. The pre-assembled and pre-wired inner functional section is positioned onto the pre-assembled and pre-wired bottom functional section and the inner functional section is electrically interconnected the bottom functional section. The pre-assembled and pre-wired top functional section is positioned onto the inner functional section, after the step of positioning the pre-assembled and pre-wired inner functional section onto the pre-assembled and pre-wired bottom functional section, and the top functional section is electrically interconnected to the inner functional section.

From the foregoing disclosure and the following more detailed description of various preferred embodiments it will be apparent to those skilled in the art that the present invention provides a significant advance in the technology and art rack mount systems. Particularly significant in this regard is the potential the invention affords for providing a high quality, reliable, low cost assembly which is easily manufactured and assembled. Additional features and advantages of various preferred embodiments will be better understood in view of the detailed description provided below.

BRIEF DESCRIPTION OF THE DRAWINGS

These and further features of the present invention will be apparent with reference to the following description and drawings, wherein.

Figure 1:
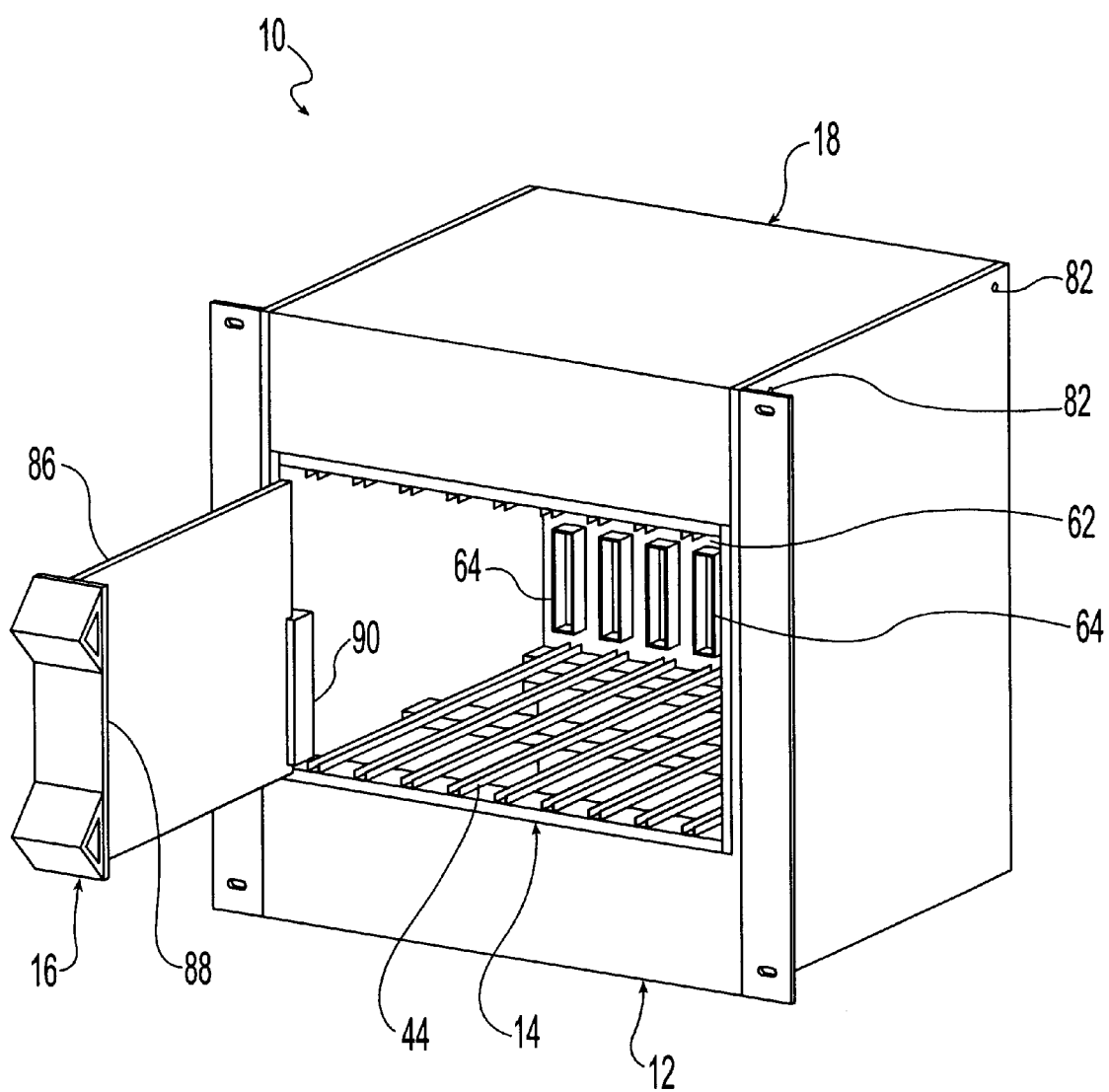
FIG. 1 is a perspective view of a modular chassis according to the present invention wherein a single pluggable computer module is shown disengaged and some components are removed from the view for clarity.

It should be understood that the appended drawings are not necessarily to scale, presenting a somewhat simplified representation of various preferred features illustrative of the basic principles of the invention. The specific design features of the rack mount system as disclosed herein, including, for example, specific dimensions, orientations, and shapes of the separate bottom, inner, and top functional sections will be determined in part by the particular intended application and use environment. Certain features of the illustrated embodiments have been enlarged or distorted relative to others to facilitate visualization and clear understanding. In particular, thin features may be thickened, for example, for clarity or illustration. All references to direction and position, unless otherwise indicated, refer to the orientation of the rack mount system illustrated in the drawings. In general, up or upward refers to an upward direction in of the plane of the paper in FIGS. 1 to 4 and down or downward refers to a downward direction in the plane of the paper in FIGS. 1 to 4. In general, front or forward refers a forward direction generally out of the paper in FIGS. 1 to 4 and rear or rearward refers to a rearward direction generally into the plane of the paper in FIGS. 1 to 4.

DETAILED DESCRIPTION OF CERTAIN PREFERRED EMBODIMENTS

It will be apparent to those skilled in the art, that is, to those who have knowledge or experience in this area of technology, that many uses and design variations are possible for the improved rack mount systems disclosed herein. The following detailed discussion of various alternative and preferred embodiments will illustrate the general principles of the invention with particular reference to a preferred embodiment. Other embodiments suitable for other applications will be apparent to those skilled in the art given the benefit of this disclosure.

Figure 2:
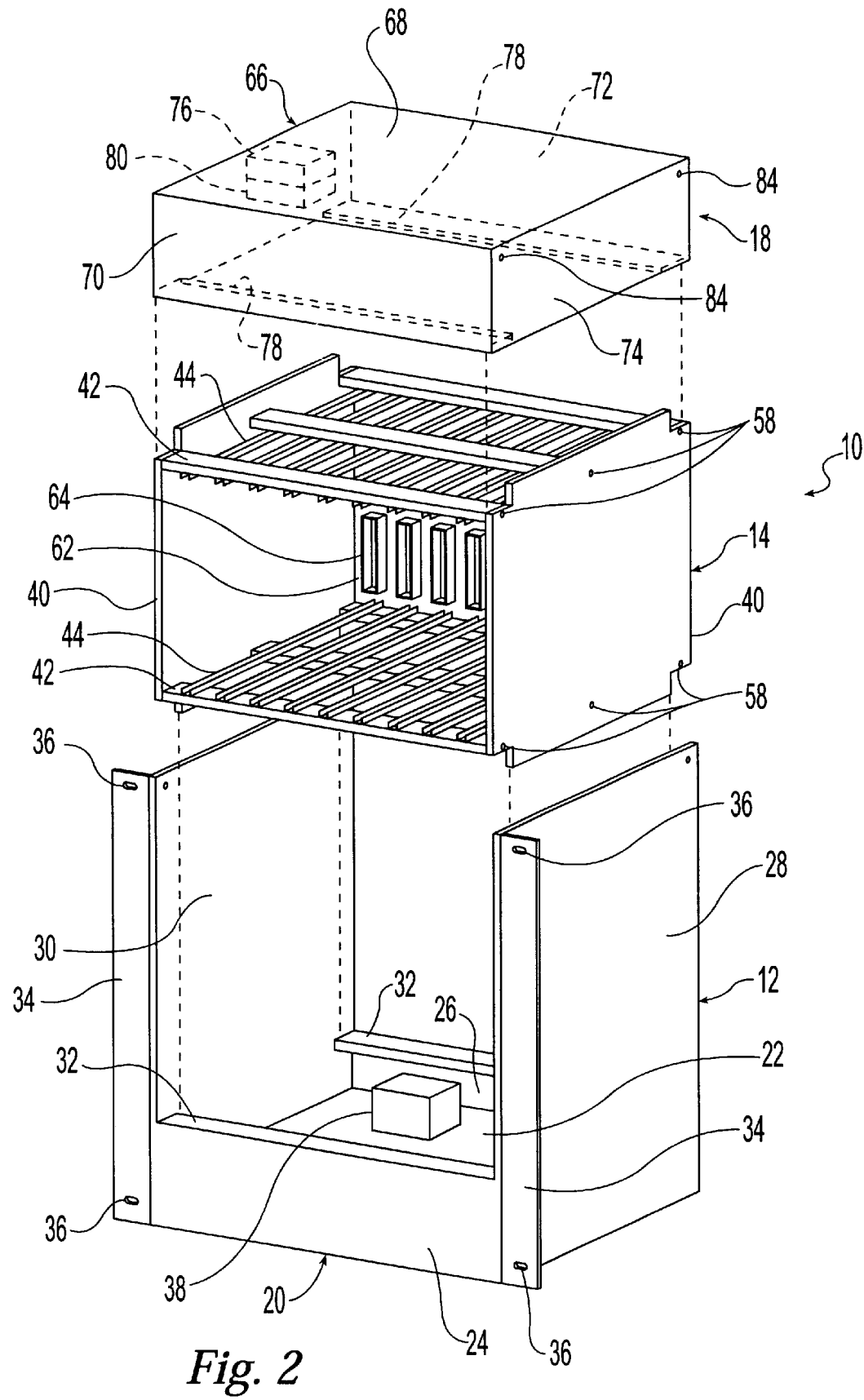
FIG. 2 is a partially exploded perspective view of the modular chassis of FIG. 1 showing bottom, inner and top functional sections, wherein some components are removed from the view for clarity.

Referring now to the drawings, FIGS. 1 and 2 show a modular chassis 10 according to the present invention. The modular chassis 10 includes three separable functional sections: a bottom functional section or assembly 12, an inner functional section or assembly 14 adapted to receive a plurality pluggable computer modules 16, and a top functional section or assembly 18 cooperating with the bottom functional section 12 to partially enclose the inner functional section 14. The three functional sections 12, 14, 18 are selectively separable and are each pre-assembled and wired prior to final assembly of the modular chassis 10 as described in more detail hereinafter.

The illustrated bottom functional section 12 includes a housing 20 having a bottom wall 22, front and rear walls 24, 26 upwardly and perpendicularly extending from the forward and rearward edges of the bottom wall 22 respectively, and a pair of side walls 28, 30 upwardly and perpendicularly extending from opposed side edges of the bottom wall 22. The side walls 28, 30 have a greater length than the front and rear walls 24, 26 to generally form forward and rearward facing openings to provide access to the inner functional section 14. The walls 24, 26, 28, 30 are preferably spaced apart to closely receive the inner functional section 14 therebetween as discussed in more detail hereinafter. The upper edges of the front and rear walls 24, 26 are inwardly turned to form a pair of laterally extending and spaced-apart support flanges 32. The illustrated flanges 32 extend the full lateral distance between the side walls 28, 30. The horizontal support flanges 32 are substantially in the same plane such that they cooperate to generally form a generally planar, albeit interrupted, support surface for the inner functional section 14 as described in more detail hereinafter. A lower compartment or space is formed below the support flanges 32 which is open between the flanges 32. The illustrated housing 20 also is provided with a pair of opposed, outwardly extending attachment flanges 34. The attachment flanges 34 extend laterally from the forward edge of the side walls 28, 30 for substantially the full length of the side walls 28, 30. The attachment flanges 34 are preferably adapted for attachment of the modular chassis 10 to a suitable support such as a rack. The illustrated attachment flanges 34 are provided with a plurality of slots 36 for cooperating with suitable mechanical fasteners. The housing 20 is preferably formed of a sheet metal such as, for example, sheet steel but alternatively can be formed in other suitable manners and of other suitable materials. Preferably, the sheet metal is pre-painted prior to forming the housing 20.

The illustrated bottom functional section 12 also includes desired computer components 38 which do not require high tolerance positioning such as, for example, power supplies, drives, fans, switches, control elements, power inlet components, air filters, and/or input/output connectors. The computer components 38 are suitably mounted within the housing 20 and wired as required. Suitable openings for the computer components 38 are provided in the housing walls 22, 24, 26, 28, 30 as required.

Figure 3:
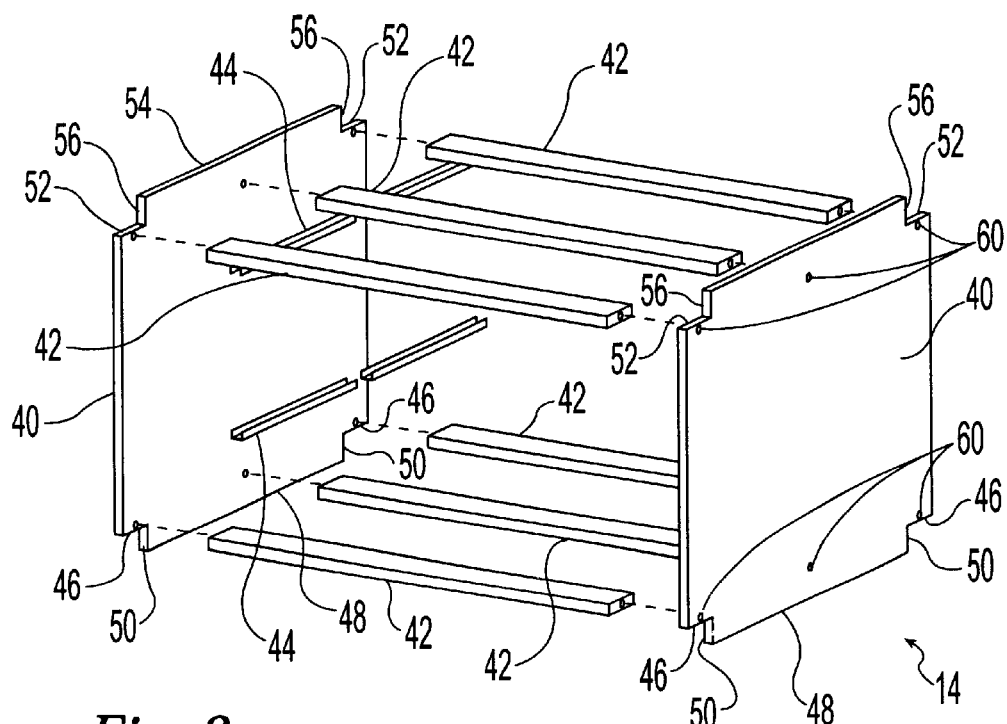
FIG. 3 is an exploded perspective view of the inner functional section of the FIGS. 1 and 2, wherein some components are removed from the view for clarity.

As best shown in FIGS. 1–3, the inner functional section 14 includes a pair of parallel spaced apart vertical end or side plates 40, a plurality of horizontal members 42 extending between and connecting the endplates 40, and a plurality of flexible module or card guides 44 supported by the horizontal members 42.

The illustrated endplates 40 are generally planar and can be formed of any suitable sheet material. The endplates 40 each form forward and rearward downward facing lower engagement surfaces 46 which are sized and shaped to cooperate with the support flanges 32 of the bottom functional section 12 to support the inner functional section 14 on the bottom functional section 12. The lower ends of the endplates 40 are provided with lower guides 48 for positioning the inner functional section 14 in a desired location relative to the bottom functional section 12. The illustrated lower guides 48 are planar extensions of the main portion of the endplate 40 and extend below the engagement surfaces 46 and between the engagement surfaces 46 to form opposed forward and rearward facing abutments or stops 50. The distance between the abutments 50 is sized such that it is slightly less than the distance between the support flanges 32. It is noted that other lower guide 48 configurations or features apparent to those skilled in the art can be alternatively utilized.

The illustrated endplates 40 also each form forward and rearward upward facing upper support surfaces 52 which are sized and shaped to cooperate with the top functional section 18 to support the top functional section 18 on the inner functional section 12. The upper ends of the endplates 40 are also provided with upper guides 54 for positioning the inner functional section 14 in a desired location relative to the top functional section 18. The illustrated upper guides 54 are planar extensions of the main portion of the endplates 40 which extend above the support surfaces 52 and between the support surfaces 52 to form opposed forward and rearward facing abutments or stops 56. The distance between the abutments 56 is sized to cooperate with the top functional section 18 as described in more detail hereinafter. It is noted that other upper guide 54 configurations or features apparent to those skilled in the art can be alternatively utilized.

The illustrated horizontal members 42 are generally elongate bars having a rectangular cross-section. It is noted, however, that the horizontal members 42 can be of any suitable shape. The illustrated embodiment includes three parallel and spaced-apart lower horizontal members 42 and three parallel and spaced-apart upper horizontal members 42. The upper horizontal members 42 are located substantially in the same plane near the support surfaces 52. The lower horizontal members 42 are located substantially in the same plane near the engagement surfaces 46. Each horizontal member 42 laterally extends between the endplates 40 and are secured to the endplates 40 to secure the endplates 40 together. The horizontal members 42 preferably abut against the inner surfaces of the endplates 40 to precisely space-apart the endplates 40. The horizontal members 42 can be secured to the endplates 40 in any suitable manner such as the illustrated mechanical fasteners 58 which extend through openings 60 provided in the endplates.

The illustrated flexible module or card guides 44 are provided at the upper surface of the lower horizontal members 42 and at the lower surface of the upper horizontal members 42. The flexible guide modules 44 are positioned in desired locations to precisely position the pluggable computer modules 16 as described in more detail hereinafter. The flexible module or card guides 44 can be of any suitable type to cooperate with the pluggable computer modules 16. Preferably, the module guides are movable between desired positions on the horizontal members 42.

The illustrated inner functional section 14 also includes a backplane 62, electrical connectors 64, and wiring. The backplane 62 is generally a planar circuit adapted electrically couple the pluggable computer modules 16 to each other and preferably to the other functional sections 12, 18. The electrical connectors 64, which are one art of two-part electrical connectors, are connected to the backplane 62 at precise locations relative to the flexible module guides 44 for electrically coupling the pluggable computer modules 16 with the backplane 62. After the endplates 40 and the horizontal members 42 are secured together and conductive plated, the inner functional section is pre-assembled by connecting the backplane 62, electrical connectors 64, and wiring. The final assembly preferably provides for limited EMI/RFI radiation protection and is chassis ground interconnected.

Figure 4:
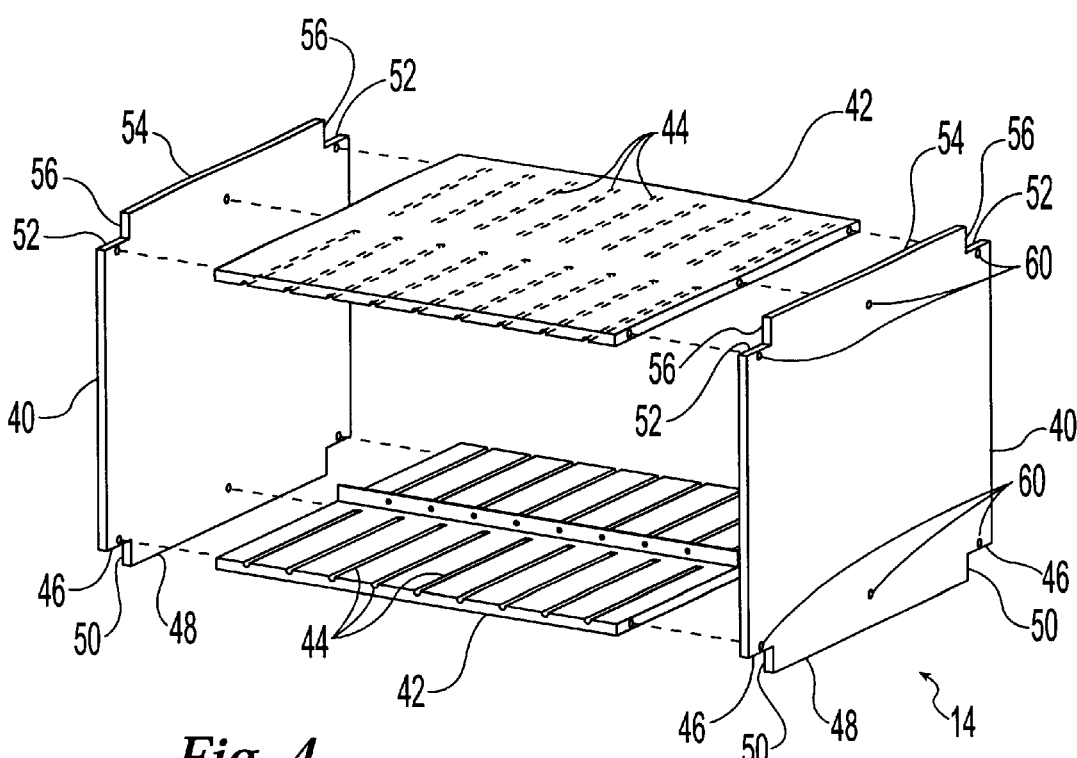
FIG. 4 is an exploded perspective view similar to FIG. 3 but showing an alternative inner functional section wherein some components are removed from the view for clarity.

As best shown in FIG. 4, the horizontal members 42 of the inner functional section 14 can alternatively be generally planar and size to substantially extend the width of the endplates 40 so that only a single upper horizontal member 42 and a single lower horizontal member is utilized. Typically in this alternative configuration, the plurality of module or card guides 44 are integral with the horizontal members 42 so that they are in fixed permanent locations. The horizontal members 42 each laterally extend between the endplates 40 and are secured to the endplates 40 to secure the endplates 40 together. The horizontal members 42 preferably abut against the inner surfaces of the endplates 40 to precisely space-apart the endplates 40. The horizontal members 42 can be secured to the endplates 40 in any suitable manner such as the illustrated mechanical fasteners 58 which extend through openings 60 provided in the endplates. It is noted that the illustrated endplates 40 are adapted to be secured to either of the alternative configurations of the horizontal members 42 so that common endplates 40 can be utilized.

As best shown in FIGS. 1 and 2, the illustrated top functional module 18 includes a housing 66 having a top wall 68, front and rear walls 20, 22 downwardly and perpendicularly extending from forward and rearward edges of the top wall 68 respectively, and a pair of side walls 74, 76 downwardly and perpendicularly extending from opposed lateral side edges of the top wall 68. The illustrated walls 70, 72, 74, 76 each have substantially the same length so that the housing 66 is generally box-shaped having a downwardly facing opening and forming an interior compartment or space therein. The lower edges of the front and rear walls 70, 72 are inwardly turned to form a pair of laterally extending and spaced-apart engagement flanges 78. The illustrated flanges 78 extend the full lateral distance between the side walls 74, 76. The horizontal engagement flanges 78 are substantially in the same plane to form a generally planar, albeit interrupted, engagement surface for contacting the inner functional section 14 as described in more detail hereinafter. The housing 66 is sized such that it is closely received between the side walls 28, 30 of the bottom functional section housing 20. The height of the housing 66 is sized such that the upper surface of the top wall 68 is generally flush, that is at the same height, as the top edge of the side walls 28, 30 of the bottom functional section housing 20. The housing 66 is preferably formed of a sheet metal such as, for example sheet steel but alternatively can be formed in other suitable manners and of other suitable materials. Preferably, the sheet metal is pre-painted prior to forming the housing 66.

The illustrated top functional section 18 also includes desired computer components 80 which do not require high tolerance positioning such as, for example, power supplies, drives, fans, switches, control elements, power inlet components, air filters, and/or input/output connectors. The computer components 80 are suitably mounted within the housing 66 and wired as required. Suitable openings for the computer components 80 are provided in the housing walls 68, 70, 72, 74, 76 as required.

Each of the functional sections 12, 14, 18 are preferably fabricated, pre-assembled, and pre-wired. The inner functional section 14 is then lowered into the bottom functional section 12 as the lower guides 48 of the inner functional section 14 guide the inner functional section 14 into a desired location within the bottom functional section 12. The inner functional section 14 is supported by the bottom functional section 12 once the engagement surfaces 46 of the endplates 40 engage the support flanges 32 of the housing 20. Forward/rearward movement of the inner functional section 14 relative the bottom functional section 12 is limited by engagement of the lower guide abutments 50 with the housing support flanges 32. Lateral movement of the inner functional section 14 relative the bottom functional section 12 is limited by engagement of the endplates 40 with the housing side walls 28, 30. The inner functional section is then electrically interconnected with the bottom functional section 14. It is noted that the inner functional section is preferably not secured to the bottom functional section 12 by fasteners or other means.

The top functional section 18 is then lowered into the bottom functional section 12 as the upper guides 54 of the inner functional section 14 guide the top functional section 18 into a desired location within the bottom functional section 12. The top functional section 18 is supported by the inner functional section 14 once the engagement flanges 78 engage the upper support surfaces 52 of the endplates 40. The top functional section 18 is preferably rigidly connected side walls 28, 30 to the bottom functional section 12 in any suitable manner such as the illustrated mechanical fasteners 82 which extend through openings 84 in the housing side walls 28, 30. Forward/rearward movement of the inner functional section 14 relative to the top functional section 18 is limited by engagement of the upper guide abutments 56 with the housing engagement flanges 78. Lateral movement of the inner functional section 14 relative to the top functional section 18 is limited by engagement of the upper guides 54 with the side walls 74, 76 of the housing 66. The top functional section 18 is then electrically interconnected with the inner functional section 14 as desired. It is noted that the inner functional section is preferably not secured to the top functional section 18 by fasteners or other means. Therefore, the inner functional section 14 is retained within the bottom and top functional sections 12, 18 without being secured to either of the bottom and top functional sections 12, 18.

The pluggable computer modules 16 can then be input into the inner functional section 14 through the front opening in the bottom functional section 12. The pluggable computer modules 16 can be of any desired type such as, for example, CPU modules, peripheral modules, drive modules, input/output modules, and power supply modules. Each pluggable computer module 16 preferably includes at least one circuit board or card 86, a front panel 88 located at the front of the circuit board 86, and a pluggable electrical connector 90 located at the back of the circuit board 86. The circuit board 86 can be either at least partially enclosed by a housing or fully exposed. The electrical connector 90 is selected to cooperate with the connectors 64 mounted on the backplane 62 of the inner functional section 14. The pluggable computer modules 16 are inserted into the inner functional section 14 at a desired location with cooperating module guides 44 until the cooperating electrical connectors 64, 90 are adequately mated and the pluggable computer module 16 is electrically coupled to the backplane 62 of the inner functional section 14.

It should be appreciated from the above description of the present invention that the bottom and top functional sections 12, 18 can be fabricated with lesser attention to tight tolerances than the inner functional section 14. It can also be appreciated that the bottom and top functional sections 12, 18 can be pre-painted and preferably formed of pre-painted sheet metal. The inner functional section 14 can have special attention to tight tolerances and can be conductive plated without affecting the pre assembly of the bottom and top functional sections 12, 18. It can be further appreciated that the endplates 40 of the inner functional sections 14 are adapted to accept at least two distinctive, differing designs of horizontal members 42 having either permanently fixed integrated module guides 44 or flexible (movable) module guides 44.

From the foregoing disclosure and detailed description of certain preferred embodiments, it will be apparent that various modifications, additions and other alternative embodiments are possible without departing from the true scope and spirit of the present invention. For example, it will be apparent to those skilled in the art, given the benefit of the present disclosure, that the bottom inner and top functional sections of the modular chassis can each have many different configurations and shapes such as the top functional section housing 66 can alternatively be supported above the bottom functional section housing 20. The embodiments discussed were chosen and described to provide the best illustration of the principles of the present invention and its practical application to thereby enable one of ordinary skill in the art to utilize the invention in various embodiments and with various modifications as are suited to the particular use contemplated. All such modifications and variations are within the scope of the present invention as determined by the appended claims when interpreted in accordance with the benefit to which they are fairly, legally, and equitably entitled.

What is claimed is:

1. A modular chassis for housing pluggable computer modules, the modular chassis comprising, in combination:
    a bottom functional section;
    an inner functional section for receiving the pluggable modules, the inner functional section supported within the bottom functional section and removable from the bottom functional section; and
    a top functional section cooperating with the bottom functional section to at least partially enclose the inner functional section and retain the inner functional section therein, the top functional section being removable from the inner functional section and removable from the bottom functional section;
    wherein the bottom functional section includes a bottom housing having a bottom wall and bottom lateral walls upwardly extending from the bottom wall to form a bottom interior compartment located below the inner functional section;
    wherein the top functional section includes a top housing having a top wall and top lateral walls downwardly extending from the top wall to form a top interior compartment located above the inner functional section.

2. The modular chassis according to claim 1, wherein the bottom functional section has computer components mounted within the bottom interior compartment which are electrically interconnected with the inner functional section.

3. The modular chassis according to claim 2, wherein the top functional section has computer components mounted within the top interior compartment which are electrically connected to the inner functional section.

4. The modular chassis according to claim 3, wherein the computer components mounted within the top interior compartment are secured only to the top housing and are carried by the top functional section when the top functional section is removed from the inner functional section and the bottom functional section.

5. The modular chassis according to claim 2, wherein the computer components mounted within the bottom interior compartment are secured only to the bottom housing and are carried by the bottom functional section when the top functional section and the inner functional section are removed from the bottom functional section.

6. The modular chassis according to claim 1, wherein the top functional section has computer components mounted within the top interior compartment which are electrically connected to the inner functional section.

7. The modular chassis according to claim 6, wherein the computer components mounted within the top interior compartment are secured only to the top housing and are carried by the top functional section when the top functional section is removed from the inner functional section and the bottom functional section.

8. The modular chassis according to claim 1, wherein the inner functional section is not secured to the bottom functional section.

9. The modular chassis according to claim 8, wherein the inner functional section is not secured to the top functional section.

10. The modular chassis according to claim 1, wherein the inner functional section has guides cooperating with the bottom functional section to position the inner functional section in a desired position relative to the bottom functional section.

11. The modular chassis according to claim 1, wherein the inner functional section has guides cooperating with the top functional section to position the inner functional section in a desired position relative to the top functional section.

12. A modular chassis for housing pluggable computer modules, the modular chassis comprising, in combination:
    a bottom functional section;
    an inner functional section for receiving the pluggable modules, the inner functional section supported within the bottom functional section, the inner functional section having a pair of vertically disposed and spaced-apart endplates, wherein the endplates are connected by one of a plurality of first horizontal members having flexible module guides and a plurality of second horizontal members having fixed module guides;

a top functional section cooperating with the bottom functional section to at least partially enclose the inner functional section; and wherein the bottom functional section includes a bottom housing having opposed inwardly extending support flanges, the inner functional section is supported by the support flanges, the endplates extend between the support flanges to limit movement of the inner functional section between the support flanges and position the inner functional section in a desired position relative to the bottom functional section.

13. The modular chassis according to claim 12, wherein the first horizontal members are generally elongate.

14. The modular chassis according to claim 13, wherein there are at least two spaced-apart first horizontal members near an upper edge of the endplates and there are at least two spaced-apart first horizontal members near a lower edge of the endplates.

15. The modular chassis according to claim 14, wherein there are three spaced-apart first horizontal members near an upper edge of the endplates and there are three spaced-apart first horizontal members near a lower edge of the endplates.

16. The modular chassis according to claim 12, wherein the second horizontal members are generally planar having a length extending a substantial portion of the length of the endplates.

17. The modular chassis according to claim 12, wherein the second horizontal members are generally planar having a length extending a substantial portion of the length of the endplates.

18. The modular chassis according to claim 17, wherein the second horizontal members are generally planar having a length substantially equal to the length of the endplates.

19. The modular chassis according to claim 17, wherein there is a single second horizontal member near an upper edge of the endplates and there is a single second horizontal members near a lower edge of the endplates.

20. The modular chassis according to claim 12, wherein the bottom, inner, and top functional sections are removable from each other.

21. The modular chassis according to claim 12, wherein the inner functional section is not secured to the bottom functional section, the inner functional section is not secured to the top functional section, and the top functional section is directly secured to the bottom functional section.

22. The modular chassis according to claim 12, wherein the top functional section includes a top housing having opposed inwardly extending engagement flanges, the engagement flanges of the top housing engage the inner functional section, the endplates extend between the engagement flanges to limit movement of the inner functional section between the engagement flanges and position the inner functional section in a desired position relative to the top functional section.

23. The modular chassis according to claim 22, wherein the inner functional section is not secured to the bottom functional section, the inner functional section is not secured to the top functional section, and the top functional section is directly secured to the bottom functional section.

24. A modular chassis for housing pluggable computer modules, the modular chassis comprising, in combination:

a bottom functional section;

an inner functional section for receiving the pluggable modules, the inner functional section supported within the bottom functional section and removable from the bottom functional section;

a top functional section cooperating with the bottom functional section to at least partially enclose the inner functional section and retain the inner functional section therein, the top functional section being removable from the inner functional section and removable from the bottom functional section, and wherein the inner functional section is not secured to the bottom functional section.

25. The modular chassis according to claim 24, wherein the inner functional section includes a housing having a top wall covering the inner functional section and the inner functional section is not secured to the top functional section.

26. A modular chassis for housing pluggable computer modules, the modular chassis comprising, in combination:

a bottom functional section;

an inner functional section for receiving the pluggable modules, the inner functional section supported within the bottom functional section and removable from the bottom functional section;

a top functional section cooperating with the bottom functional section to at least partially enclose the inner functional section and retain the inner functional section therein, the top functional section being removable from the inner functional section and removable from the bottom functional section, and wherein the inner functional section includes a housing having a top wall covering the inner functional section and the inner functional section is not secured to the top functional section.

27. The modular chassis according to claim 26, wherein the top functional section is directly secured to the bottom functional section.

28. The modular chassis according to claim 26, wherein the top functional section is supported by the inner functional section.

29. A method of assembling a modular chassis for housing pluggable computer modules, the method comprising, in combination, the steps of:

providing components for a bottom functional section including a bottom housing having a bottom wall and bottom lateral walls upwardly extending from the bottom wall to form a bottom interior compartment;

pre-assembling and wiring the bottom functional section including mounting bottom computer components within the bottom interior compartment;

providing components for an inner functional section;

pre-assembling and wiring the inner functional section for receiving the pluggable computer modules;

providing components for a top functional section including a top housing having a top wall and top lateral walls downwardly extending from the top wall to form a top interior compartment;

pre-assembling and wiring a top functional section including mounting top computer components within the top interior compartment;

positioning the pre-assembled and pre-wired inner functional section onto the pre-assembled and pre-wired bottom functional section with the bottom interior compartment located below the inner functional section and electrically interconnecting the inner functional section and the bottom functional section; and positioning the pre-assembled and pre-wired top functional section onto the inner functional section with the top interior compartment located above the inner functional section, after the step of positioning the pre-assembled and pre-wired inner functional section onto the pre-assembled and pre-wired bottom functional section, and electrically interconnecting the top functional section and the inner functional section.

30. The method according to claim 29, wherein the step of positioning the pre-assembled and pre-wired inner functional section onto the pre-assembled and pre-wired bottom functional section includes the step of guiding the inner functional section to a desired position relative to the bottom functional section by supporting the inner functional section on flanges of the bottom housing and extending the inner functional section between the flanges to limit movement of the inner functional section between the flanges.

31. The method according to claim 30, wherein the step of positioning the pre-assembled and pre-wired top functional section onto the pre-assembled and pre-wired inner functional section includes the step of guiding the top functional section to a desired position relative to the inner functional section by engaging the inner functional section with engagement flanges of the top housing and extending the inner functional section between the engagement flanges to limit movement of the inner functional section between he flanges.

32. The method according to claim 29, further comprising the step of securing the top housing to the bottom housing to retain the inner functional section without securing the inner functional section to the bottom functional section and without securing the inner functional section to the top functional section.

* * * * *